United States Patent [19]

Lavene

[11] Patent Number: 5,032,950
[45] Date of Patent: Jul. 16, 1991

[54] CUFFED TAPE WRAP AND FILL WOUND CAPACITOR

[75] Inventor: Benard Lavene, Ocean, N.J.

[73] Assignee: Electronic Concepts, Inc., Eatontown, N.J.

[21] Appl. No.: 523,819

[22] Filed: May 15, 1990

Related U.S. Application Data

[63] Continuation-in-part of Ser. No. 453,676, Dec. 20, 1989, Pat. No. 4,980,798.

[51] Int. Cl.⁵ .......................... H01G 1/14; H01G 7/00
[52] U.S. Cl. .................................... 361/306; 361/402; 29/25.42
[58] Field of Search ............... 29/25.42; 361/306, 308, 361/309, 310, 400, 402

[56] References Cited

U.S. PATENT DOCUMENTS

| | | | |
|---|---|---|---|
| 2,183,550 | 12/1939 | Deutschmann | 29/25.42 X |
| 2,305,849 | 12/1942 | Dorn | 361/304 |
| 2,820,934 | 1/1958 | Mullikin | 361/308 |
| 3,215,909 | 11/1965 | Schill et al. | 361/273 |
| 3,482,154 | 12/1969 | Robinson | 29/25.42 X |
| 3,828,227 | 8/1974 | Millard et al. | 361/536 |
| 3,891,901 | 6/1975 | Booe et al. | 361/309 |
| 3,917,986 | 11/1975 | Rice et al. | 361/304 |
| 4,538,205 | 8/1985 | Lavene | 361/308 |
| 4,603,373 | 7/1986 | Lavene | 29/25.42 X |
| 4,603,373 | 7/1986 | Lavene | 361/306 |
| 4,614,995 | 9/1986 | Lavene | 361/308 |
| 4,685,026 | 8/1987 | Lavene | 361/308 |

Primary Examiner—Donald A. Griffin
Attorney, Agent, or Firm—Ratner & Prestia

[57] ABSTRACT

A wrap and fill capacitor having an cuffed tape outer wrapping is provided. The cuffs comprise a conductive foil folded about, or extending beyond, the edges of a high temperature resistant dielectric tape. The device is particularly suited for surface mounting.

15 Claims, 2 Drawing Sheets

CUFFED TAPE WRAP AND FILL WOUND CAPACITOR

This application is a continuation-in-part of application Ser. No. 07/453,676, filed Dec. 20, 1989, now U.S. Pat. No. 4,980,798.

BACKGROUND OF THE INVENTION

1. Field of the Invention

This invention relates to wrap and fill capacitors, particularly to surface mount wrap and fill capacitors, having conductive cuffs on the periphery of the wrapping.

2. Description of Related Art

Direct mounting of electrical components, such as capacitors, is widely practiced in the production of high density electronic packages. Connections to a circuit board are made by reflow soldering or similar means. Generally, the component has been required to have external terminal leads in order to provide a multiplicity of such components on a board to achieve the desired package density and compatibility with other components. Previous methods of surface mounting wound capacitors are deficient both for relatively high costs and the presence of the protruding terminal leads. Further, many applications involved exposure of the element to environmental stresses which severely strain the element.

U.S. Pat. No. 4,603,373 discloses a metallized wound capacitor in which first and second elongated dielectric webs are convolutely arranged in a capacitor roll. A third dielectric web is wound about the capacitor roll to form a protective wrap. The third web has a first and a second metallic foil band secured to the side of the third web remote from the capacitor roll and each band is disposed adjacent a respective end of the roll. The bands serve as terminals which may be electrically connected to a circuit board. Although this construction offers many advantages, it is not amenable to sealing and, therefore, has limited utility.

SUMMARY OF THE INVENTION

A wrap and fill capacitor having a cuffed tape outer wrapping is provided. The cuff comprises a thin conductive foil which, in one embodiment, is folded about the sides of a high temperature resistant dielectric tape. Alternatively, the cuff takes the form of a band extending beyond the side edges of the tape. The device is particularly suited for surface mounting.

BRIEF DESCRIPTION OF THE DRAWINGS

FIG. 1d is a cross section along plane A—A of FIG. 1a.

DETAILED DESCRIPTION OF THE INVENTION

Referring now to FIGS. 1a through 2b, the capacitor of this invention comprises a pressed capacitor winding 10 wrapped with a high temperature resistant tape 12 having conductive foil cuffs. The cuffs are provided either in the form of bands 14, as in FIG. 1, or in the form of folds 24, as in FIG. 2.

The capacitor winding is prepared by methods known to those skilled in the art, typically from strips or webs of a dielectric having electrically conductive material disposed thereon. Usually, two or more such webs are wound together with a layer of dielectric between the conductive layers to insulate the electrodes from each other. Optionally, the capacitor winding may be pressed into some desired shape. Various methods of fabrication and types of materials may be employed in the manufacture of capacitor windings and this invention is not limited to any specific winding technology.

Figure 1D:
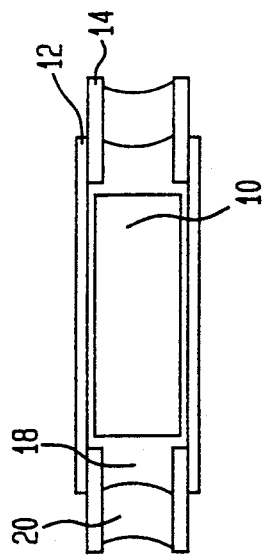
Figure 1B:
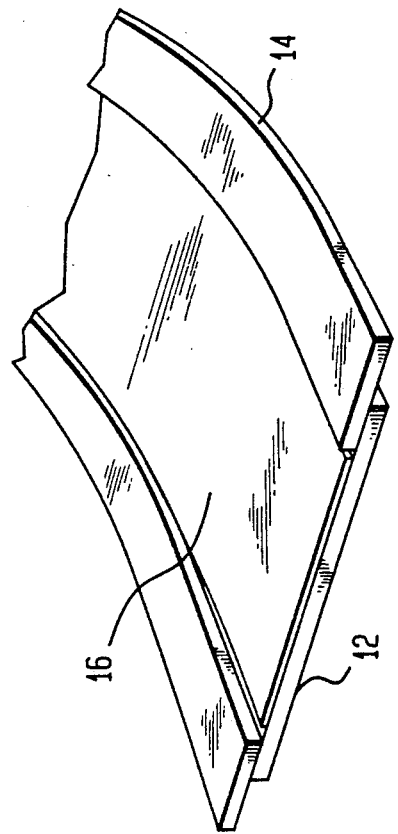
FIG. 1b is a view of the tape with the band prior to wrapping around the capacitor winding.
Figure 1C:
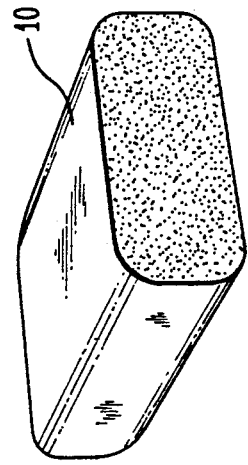
FIG. 1c is a perspective view of a typical capacitor winding.
Figure 1A:
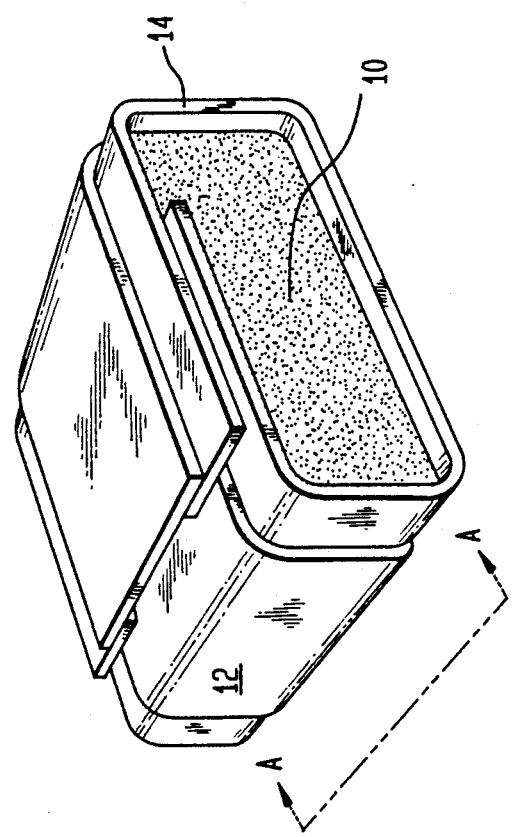
FIG. 1a is a perspective view of an unsealed capacitor element having a thin conductive foil band tape wrap.

Referring now to FIG. 1b, the high temperature resistant tape 12 is illustrated with conductive cuff 14 in the form of a band laminated to and extending beyond the side edges of the tape. The tape is provided with an adhesive coating 16 between the cuffs. The tape is prepared from a suitable high temperature resistant material, such as a polyamide. A preferred polyamide tape is that sold by Dupont under the mark Kapton polyamide. Adhesive is applied to the region of the tape between each cuff to bond the tape to the capacitor winding. The adhesive may be a pressure sensitive adhesive or a hot melt adhesive. There is, however, no adhesive on the exterior surfaces of the banded cuffs. The cuffs may be prepared from any flexible conductive material. Metal foil, such as copper or tin-copper foil, is preferred. It is not necessary that the banded cuff be centered on the edges of the tape; nor is it necessary that each cuff be similarly positioned.

The width of the capacitor winding 10 is such as to fit between cuffs 14. After wrapping the capacitor winding with the banded tape, the recessed ends of the winding are sprayed with a zinc/tin alloy 18. The entire device is masked before spraying so as to avoid overspraying the exterior of the device. The spray provides electrical contact between the capacitor winding and the banded cuffs. The ends are then sealed with an appropriate sealing means, such as a high temperature epoxy or silicon resin 20. The device is then tin zippered to bond the copper to itself and the copper is tin plated. The fully assembled element is thus a sealed capacitor having integrated electrodes, ideally suited for surface mounting.

Figure 2B:
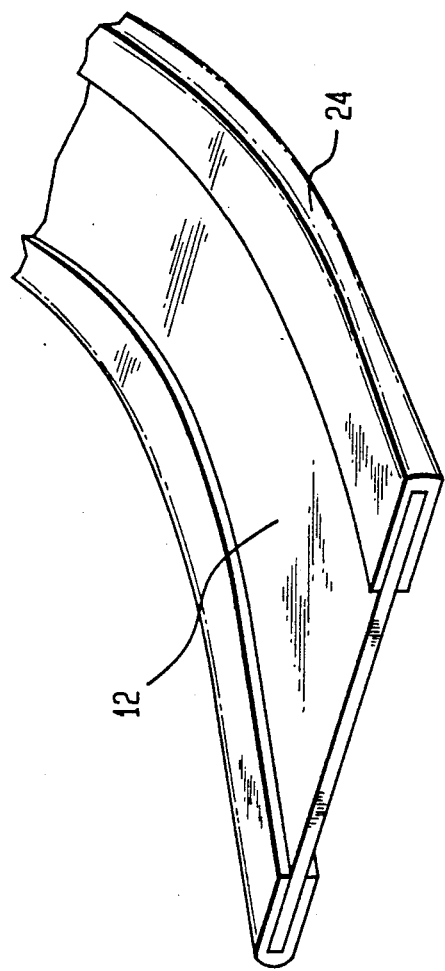
FIG. 2b is a view of the tape with the cuff prior to wrapping around the capacitor winding.
Figure 2A:
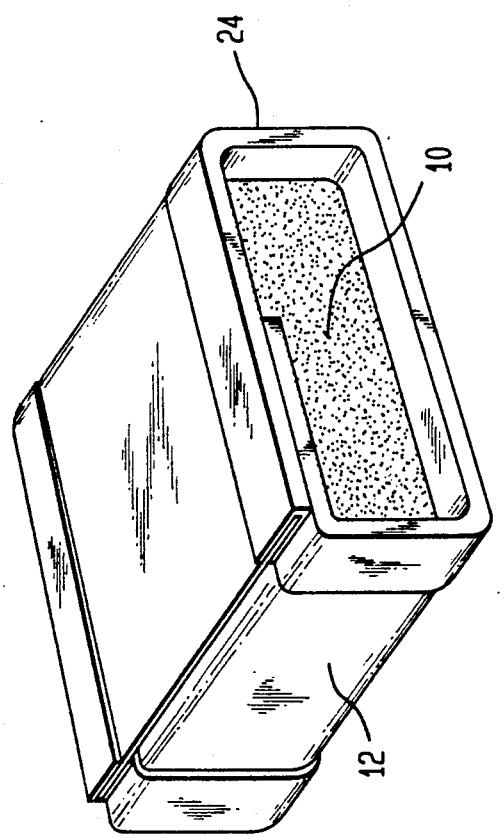
FIG. 2a is a perspective view of an unsealed capacitor element having a thin conductive foil cuff tape wrap.

In an alternative embodiment, as illustrated in FIG. 2, the cuffs 24 are folded about the edges of the tape 12. Referring now to FIG. 2b, the high temperature resistant tape 12 is illustrated with conductive cuffs 24 prior to wrapping. Adhesive is applied to the region of the tape between the cuffs to bond the tape to the capacitor winding. The adhesive may be a pressure sensitive adhesive or a hot melt adhesive. Optionally, adhesive is applied to the interior of the folded cuff surface to improve the adhesion of the cuff to the tape. There is, however, no adhesive on the exterior surfaces of the cuff. The cuff may be prepared from any flexible conductive material. Metal foil, such as copper or tin-copper foil is preferred. It is not necessary that the cuff be symmetrically disposed about the edges of the tape. As before, the width of the capacitor winding 10 is such as to fit between foil cuffs 24. After wrapping the capacitor winding with the folded cuff tape, the device is finished as described above for the banded cuff embodiment. The fully assembled element is thus a sealed capacitor having integrated electrodes, ideally suited for surface mounting.

In one embodiment 0.5 mil thick Cu foil was formed into cuffs extending 1/16 inch around both edges of a ⅜ inch wide, 1 mil thick Kapton polyamide tape having a pressure sensitive adhesive on the tape surface (Permacel 221 tape). A ¼ inch capacitor winding was then wrapped with 1½ turns of this tape and the element finished. It is envisioned that this process can be performed continuously with the capacitor winding moving directly to the tape wrapping step.

Although the present invention has been described with reference to particular embodiments, this description should not be construed as placing any undue limitations on the invention as claimed herein.

What is claimed is:

1. A wrap and fill capacitor comprising:
   a. a capacitor winding;
   b. a thermally and electrically insulating tape wrapped around and adhered to said capacitor winding, both edges of said tape extending beyond the ends of said winding, thereby creating opposed recesses;
   c. conductive cuffs on both edges of said tape, at least part of each said cuff located on the exterior surface of the tape for surface mount electrical contact, said capacitor winding seated in the space between the cuffs;
   d. conductive material partially filling the recesses to provide electrical contact between the winding and the cuffs; and
   e. means for sealing the ends.

2. A capacitor of claim 1 in which the cuffs comprise bands extending beyond the edges of the insulating tape.

3. A capacitor of claim 2 in which said thermally and electrically insulating tape is a polyamide tape.

4. A capacitor of claim 2 in which the conductive cuff comprises metal foil.

5. A capacitor of claim 2 in which the conductive material filling the recess is a zinc-tin alloy.

6. A capacitor of claim 2 in which the means for sealing is a high temperature epoxy or silicon resin.

7. A capacitor of claim 2 in which the tape is adhesively attached to the pressed winding.

8. A capacitor of claim 1 in which the cuff comprises a foil folded over both edges of said tape.

9. A capacitor of claim 8 in which said thermally and electrically insulating tape is a polyamide tape.

10. A capacitor of claim 8 in which the conductive cuff comprises metal foil.

11. A capacitor of claim 8 in which the conductive material filling the recess is a zinc-tin alloy.

12. A capacitor of claim 8 in which the means for sealing is a high temperature epoxy or silicon resin.

13. A capacitor of claim 8 in which the tape is adhesively attached to the pressed winding.

14. A method for fabricating a wrap and fill capacitor comprising:
   a. coating a dielectric tape with an adhesive;
   b. fitting conductive cuffs on both edges of said tape, said cuffs partially covering both sides of said tape;
   c. preparing a capacitor winding of a size to fit between the cuffs on said tape;
   d. wrapping said winding with the cuffed dielectric tape, thereby providing a wrapped capacitor element having recesses at both ends;
   e. partially filling said recesses with a conductive material;
   f. sealing the partially filled recesses; and
   g. soldering and plating the conductive cuffs.

15. A method for fabricating a wrap and fill capacitor comprising:
   a. coating a dielectric tape with an adhesive;
   b. applying conductive cuffs to both edges of said tape, said cuffs partially covering one side of said tape and extending beyond the edges of said tape;
   c. preparing a capacitor winding of a size to fit between the cuffs on said tape;
   d. wrapping said winding with the cuffed dielectric tape, thereby providing a wrapped capacitor element having recesses at both ends;
   e. partially filling said recesses with a conductive material;
   f. sealing the partially filled recesses; and
   g. soldering and plating the conductive edges.

* * * * *